United States Patent [19]

Cusdin

[11] Patent Number: 4,927,723
[45] Date of Patent: May 22, 1990

[54] RELIEF PRINTING PLATE MANUFACTURE

[75] Inventor: George B. Cusdin, St. Albans, England

[73] Assignee: W. R. Grace Limited, London, England

[21] Appl. No.: 203,782

[22] Filed: Jun. 7, 1988

[30] Foreign Application Priority Data

Jun. 17, 1987 [GB] United Kingdom ............... 8714177

[51] Int. Cl.$^5$ .......................... G03F 7/02; G03L 3/00
[52] U.S. Cl. ...................................... 430/15; 430/300;
430/306; 430/309; 430/325; 430/328; 430/394;
430/494
[58] Field of Search ............... 430/269, 300, 302, 306,
430/309, 320, 322, 325, 328, 394, 396, 494, 11,
14, 15; 101/453, 484, 463.1, 456

[56] References Cited

U.S. PATENT DOCUMENTS

| | | | |
|---|---|---|---|
| 3,408,191 | 10/1968 | Jeffers | 96/28 |
| 3,663,222 | 5/1972 | Akamatsu et al. | 96/35.1 |
| 3,703,864 | 11/1972 | Bradford | 101/369 |
| 3,951,657 | 4/1976 | Recchia et al. | 96/35.1 |
| 3,962,002 | 6/1976 | Finkbeiner et al. | 156/3 |
| 4,087,182 | 5/1978 | Aiba et al. | 355/100 |
| 4,101,324 | 7/1978 | Mizino et al. | 430/306 |
| 4,557,995 | 12/1985 | Broers et al. | 430/296 |
| 4,600,667 | 7/1986 | Uchida | 430/306 |
| 4,668,607 | 5/1987 | Wojcik | 430/394 |
| 4,720,448 | 1/1988 | Mousseau | 430/306 |

FOREIGN PATENT DOCUMENTS 5387801  8/1978  Japan ..................... 430/394

*Primary Examiner*—Jose Dees
*Assistant Examiner*—Donald J. Loney
*Attorney, Agent, or Firm*—John J. Wasatonic; William L. Baker

[57] ABSTRACT

A relief flexographic printing plate is prepared by image-wise exposure of the "printing face" of a layer of photocurable polymer through a negative 7 and image-wise back exposure of the layer 4 through a support sheet 3 and a positive 6 of the image to be printed, thereby selectively curing the floor regions 9 of the printing plate in register with the uncured areas 8 left in the printing face of said layer.

Preferably a further non-selective back exposure operation is carried out for additionally curing the floor regions.

16 Claims, 5 Drawing Sheets

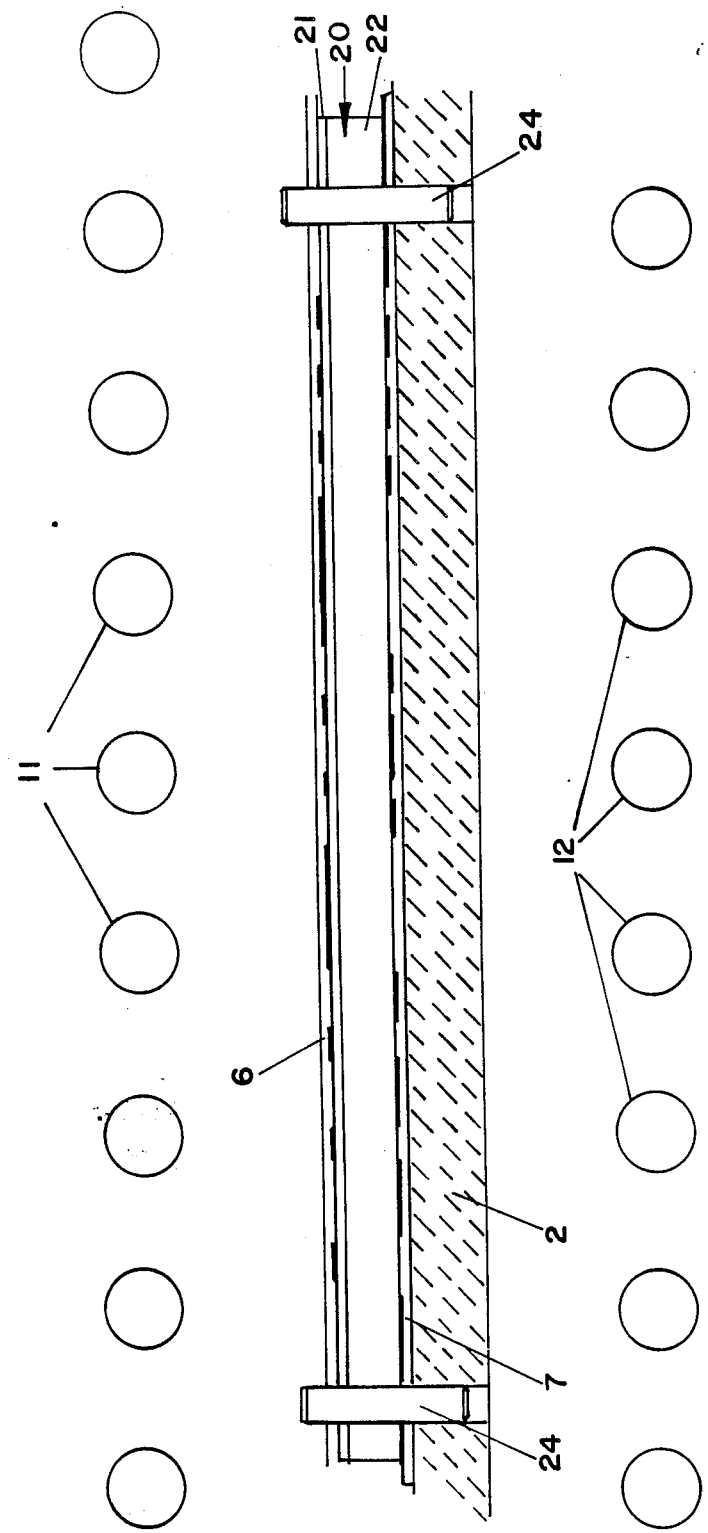

RELIEF PRINTING PLATE MANUFACTURE

The present invention relates to the manufacture of relief printing plates by a photographic technique.

It is know to manufacture a relief printing plate by spreading a layer of liquid photocurable polymer on a support and then exposing one face of the photocurable polymer through a negative of the desired image, whereupon areas which are intended to be inked on the finished image (being transparent in the negative), are exposed to form relief printing areas, whereas the non-inked background areas on the image, being opaque, e.g. black, on the negative, do not cure and can be removed during the subsequent operations of finishing the plate. Such a plate may, for example, be a half tone plate in which case there will be a very fine network of transparent dots of varying sizes on the negative used for the exposure operation, and these will give rise to a corresponding network of relief dots of varying sizes on the finished plate. In areas of the negative corresponding to very dark or apparently solid areas of print on the finished image there will be a network of very small opaque dots on the negative, giving rise to small voids, known as "shadow reverses", between the raised areas on the finished relief printing plate. Conversely, on light areas of the image there will be a network of small transparent areas in a generally opaque area of the negative, giving rise to correspondingly small raised areas of the printing plate, known as "highlight dots".

In another process, the polymer may be solid and already attached to a backing sheet, but in an uncured form which makes it possible to dissolve the solid photopolymer remaining uncured after exposure, in order to develop the relief image.

In order to stabilize the printing plate, with both the solid polymer and liquid polymer versions of the process, it has been known to carry out a so-called back exposure operation in which the reverse face of the photocurable polymer, i.e. the face opposite the printing face of the finished relief printing plate, is exposed to a uniform radiation field through the support sheet, whereby the polymer is caused to cure and conventionally also to adhere to the support sheet in both image areas and non-image areas. Subsequently, the relief areas are formed by image-wise exposure to the negative (through a cover sheet which is to the opposite side of the photocurable polymer from the support sheet).

The exposing operations are the same between the two different types of plates mentioned above, in that the direction of the incident radiation relative to the plate is the same. However, the solid plate may be inverted on the processing bed and thus all the exposures may be carried out with a single set of lamps whereas with the liquid polymer the possibility of back exposure requires a second set of lamps to expose what will become the rear face of the printing plate.

A difficulty arises when preparing thin flexographic printing plates, for example of 2 to 3 mm overall thickness, with a minimum relief, for example of 1 mm, which forms a substantial proportion of the thickness of the finished plate. The back exposure needed to produce the cured floor of 1 to 2 mm over the entire plate will give the appropriate floor depth in areas where the image-forming negative is predominantly transparent, but in small opaque areas of the negative, corresponding to "shadow reverses" of the printing plate, there will be a tendency for these reverses to fill in because the back exposure operation tends to negate the effect of the masking of the fine opaque area of the negative and nevertheless to cure the polymer in what should correspond to a small uncured zone of the printing plate. If the back exposure operation is correspondingly curtailed in order to avoid this tendency, the stability of the highlight dots in other parts of the plate may be jeopardized through the formation of an excessively thin floor to the relief plate.

It is an object of the present invention to overcome the above shortcoming.

Accordingly, the present invention provides a process for preparing a relief printing plate comprising image-wise exposing a surface of a layer of uncured photocurable polymer to a negative pattern of the desired image to be printed, in order to form, on the exposed surface, cured relief printing areas which correspond with the transparent regions of the negative and uncured areas which will correspond with recessed floor portions at voids formed in register with the opaque portions of the negative; and exposing the uncured polymer through its surface opposite the first-mentioned surface to harden the floor areas and the support for the said cured relief areas; characterised in that the exposing through said other surface of the polymer includes image-wise exposing the opposite surface of the layer to a positive of the image to be printed, thereby curing floor areas substantially in register with said uncured areas resulting from the negative exposure operation.

By using a positive of the image as a mask for the back exposure step, in substantial registration with the negative used for the main exposure step it is possible to ensure that, in those areas of the plate where delicate printing relief areas (for example highlight dots) are to arise, there is a substantial floor in order to stabilize the highlight dots, whereas in other areas of the plate (where the relief printing areas predominate) the floor thickness formed through back exposure is correspondingly reduced to preserve the openness of the fine uncured "shadow reverses" through the use of a part of the positive which is predominantly opaque as the mask for the back exposure operation.

Through the simple expedient of using a positive of the very image which is to be used for manufacture of the relief pattern on the plate, it is possible to ensure that the mask used for back exposure is tailor made for the plate in question, and the desired stability of the fine relief printing areas in highlight areas of the plate can be guaranteed without filling in of the fine voids defining the shadow reverses of the plate.

Preferably the back exposure operation is carried out in two stages, the first involving part of the back exposure operation carried out uniformly to ensure thorough curing of the floor areas of the printing plate, and the second involving selective back exposure through the image positive, for a proportion of the total back exposure time normally required.

More preferably, the duration of the selective back exposure operation is greater than the duration of the uniform back exposure operation. These two parts of the back exposure operation may be carried out in either sequence, but it is particularly advantageous when using liquid photocurable polymer for the uniform back exposure operation to occur simultaneously with the main exposure and for the selective back exposure operation to be carried out later subsequently in order to maintain substantial registration of the films.

In order that the present invention may more readily be understood the following description is given, merely by way of example, with reference to the accompanying drawings in which:

FIG. 6 shows a cross-section of a modification of the embodiment of plate-making apparatus of FIG. 4, taken on the plane 6—6 thereof.

Figure 1:
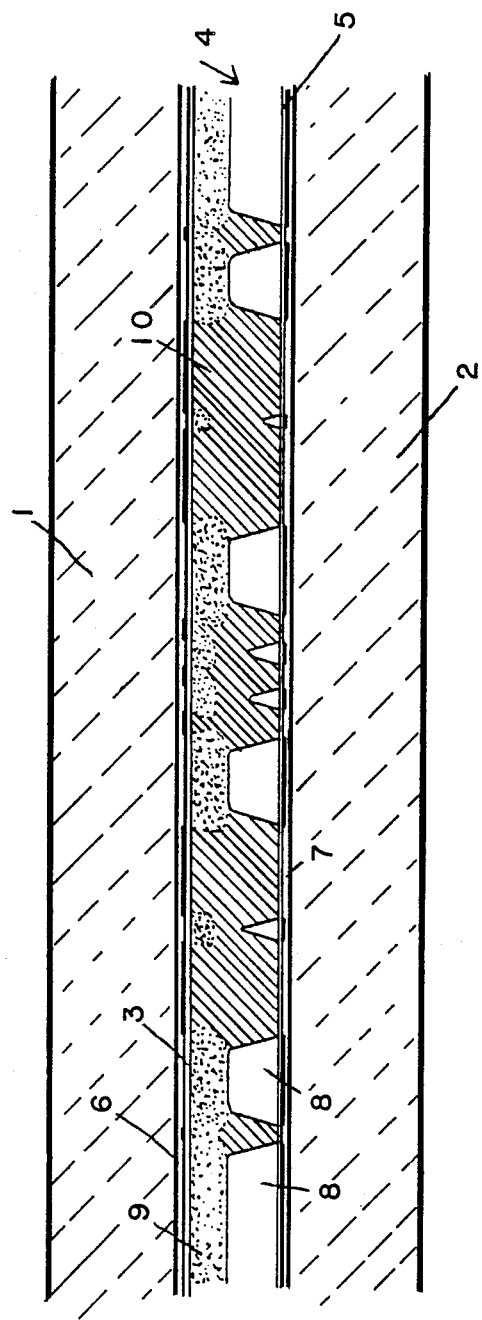
FIG. 1 shows a detail of the upper and lower glasses and the various films and the polymer layer in their configuration during plate making.

Referring firstly to FIG. 1, there can be seen the "sandwich" of the upper glass 1, the lower glass 2, a backing sheet 3 placed above a layer of liquid photocurable polymer 4, and a protective film 5 placed below the polymer 4. Between the backing sheet 3 and the upper glass 1 is a sheet of photographic film 6 bearing a positive image of the material eventually to be printed by that particular plate, and likewise between the protective sheet 5 and the lower glass 2 is a sheet of photographic film 7 bearing a negative of the image to be printed using that particular printing plate. The images of the two photographic film sheets 6 and 7 are at least substantially in register one above the other.

The liquid photocurable composition 4 shows in its underside various uncured areas 8 which will after processing form voids and the remainder of the composition is comprised of floor areas 9 indicated by a pattern of dots and referred to later as selectively formed floor areas and the cured remainder 10 of the plate indicated by cross-hatching and having been formed by the selective main exposure operation to form the voids 8.

Figure 2:
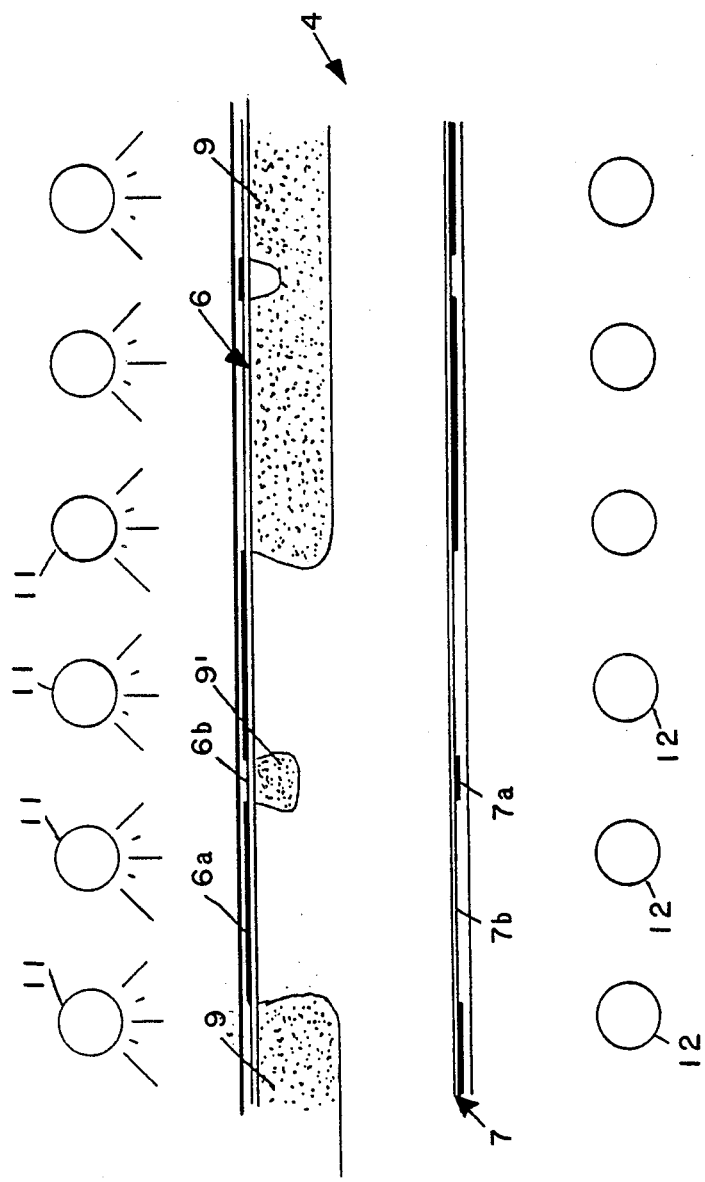
FIG. 2 shows a cross-section through the photopolymer and the positive and negative films during the selective back-exposure operation.

FIG. 2 shows the first stage of a typical process for forming the uncured and cured printing plate areas shown in FIG. 1. During this stage a set of exposure lamps 11 for effecting the back exposure operation is energized and the upper surface of the liquid photocurable composition 4 is selectively exposed through the positive photographic film sheet 6 on which opaque (coloured, e.g. black) areas 6a mask the liquid polymer from exposure whereas transparent areas 6b allow the formation of the cured portions 9 of the polymer.

As can be seen in FIG. 2, where there is a small transparent region 6b this will form a back exposed region 9' which is both small in horizontal extent and also shallow in depth, as compared with the much more extensive and much deeper regions where there is a larger transparent zone.

It is important to note that there is a further set of exposure lamps 12 below the sandwich of photocurable polymer and other sheets, and that the two photographic film sheets 6 and 7 are in substantial registration in that the solid zones 7a of the negative film sheet correspond in and in position to the transparent zones 6b of the positive film sheet, and vice versa.

Figure 3:
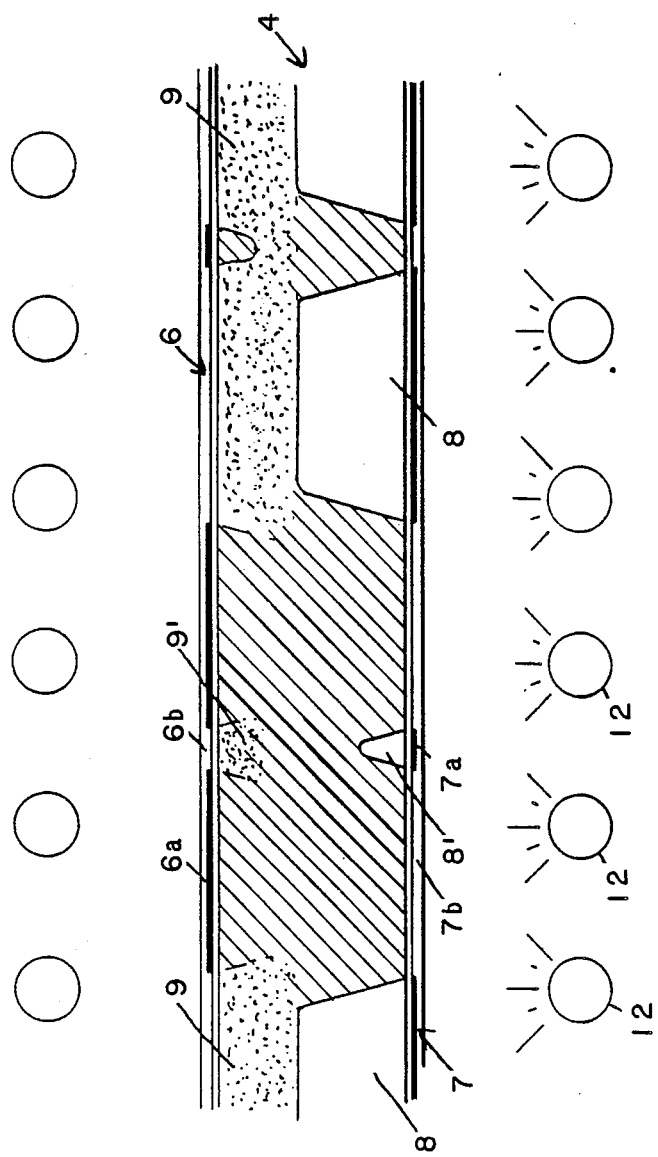
FIG. 3 shows a cross-section, corresponding to FIG. 2, but during the main exposure operation.

FIG. 3 shows the main exposure operation which may be carried out subsequently to or concurrently with or before the selective back exposure step just described. Here the lower main exposure lamps 12 are energized to expose the underside of the photocurable polymer 4 selectively through the negative 7. This leaves uncured areas 8 which will form the voids.

It should be noted that the small uncured region 8' of FIG. 3, corresponding to a small opaque region 7a of the negative film sheet 7, is also shallow in depth as compared with the other uncured regions 8 shown in FIG. 3.

During this selective main exposure step the liquid composition surrounding what are shown as uncured regions in the polymer becomes cured so that in the lower layers of the polymer there will be substantially well cured areas defining the relief printing areas of the plate and separated by uncured regions which are shown schematically in the drawings as voids, but which are only evident as voids once the exposed plate has been subjected to an etching operation to remove the uncured still liquid polymer from the regions 8 and 8'.

Either simultaneously with the selective main exposure operation shown in FIG. 3, or before or after that operation, the optional non-selective back exposure operation is carried out.

Alternatively, the main exposure operation may be carried out for long enough to cure the liquid photopolymer right through to the support sheet 6, but it is preferable for the upper part of the polymer to be cured by a non-selective back exposure operation since the thickness of photocurable polymer to be penetrated by the radiation from the exposure lamps (in this case the upper exposure lamps 11) is less than for the lower or main exposure lamps 12.

Naturally, when the above-mentioned optional back exposure operation is carried out, the positive image-bearing original film sheet 6 will have been removed so as to remove the masking effect shown in FIG. 2.

The above-described process can be carried out in a conventional liquid photocurable printing plate imaging machine by a minor modification of the normal operating procedure.

Alternatively the process can be carried out in conventional machine for imaging photocurable printing plates, by a minor addition to the normal operating procedure.

Initially the normal cycle is used to enable the plate to be formed. The main exposure to the image forming negative would be of sufficient duration to stabilize the smallest element required, and the non-selective back exposure would be approximately 20% of that normally applied to form the supporting floor area.

An additional step is now proposed in accordance with the present invention. The original photographic film 6 is placed on the backing sheet 3 in substantial register with the now existing image on the plate. The upper glass 1 is lowered, thus holding the film 6 in position, and a further selective back exposure is carried out to support the small elements of image formed during the already completed main exposure.

Finally the upper glass 1 is raised to allow the sheet of cured photopolymer to be removed and further processed to remove the uncured photopolymer as previously described.

EXAMPLE 1

In an example of the manufacture of a photocurable relief printing plate by the method in accordance with the present invention, the following sequence of steps was carried out on a Letterflex FLEXO II machine marketed by W. R. Grace Ltd, by a slight modification of the normal cycle of the FLEXO II machine.

Firstly the activity of the polymer (in terms of the time taken to cure 1 mm of the liquid polymer using the back exposure operation) was determined. Typically this will be between 30 and 70 sec/mm, depending on the polymer type.

For a 5 mm plate the floor thickness was chosen to be 2 mm (40% of 5 mm). For example, with a polymer activity of 40 sec/mm, the exposure required to form this 2 mm thick floor will be 80 seconds (2 mm×40 sec/mm). The remaining thickness available in this example for the printing plate relief height will be 3 mm which for the same, polymer requires a main exposure of 120 seconds, i.e. 3 mm×40 sec/mm (in order to ensure adequate curing and hardening of the relief printing areas).

Initially the normal cycle was used to enable (a) the negative-bearing photographic film 7 to be placed on the lower glass 2; (b) the protective sheet 5 to be placed thereon; (c) a uniform layer 4 of liquid photocurable composition to be dispensed onto the protective sheet 5 and, if necessary, levelled; and (d) the backing sheet 3 to be placed on that layer of liquid composition.

As an additional step now proposed by the present invention, the photographic film 6 bearing the positive image was placed on the backing sheet 3 in substantial visual register.

As a further additional step the bottom glass was lowered by a distance equal to the thickness of the positive-bearing photographic film 6, in order to position the upper interface of the assembly at the right level.

The automatic exposure sequence was then restarted so that the upper glass 1 descended slowly to "tolerance", i.e. to reduce the thickness of the liquid photocurable polymer to the desired finished plate thickness and to remove substantially all traces of air from the "sandwich".

Then the selective back exposure operation and a main exposure operation were automatically carried out, preferably simultaneously, the selective back exposure operation being carried out for a proportion of the normal total back exposure time.

The upper glass 1 was then raised and the machine reverted to manual operating mode to allow the positive-bearing photographic film 6 to be removed, the upper glass 1 once more to be lowered towards the backing sheet 3, and a non-selective remainder of the back exposure operation to be carried out to ensure that all areas other than those indicated as cavities 8 are exposed to the upper exposure lamps 11.

Finally, the upper glass 1 was again raised to allow the sheet of cured photopolymer to be removed ready for an etching operation by an air jet to blow away the remaining liquid areas. (Alternatively the developing operation may be a washing operation in which the film is immersed in a washing solution, for example in a bath activated by ultrasonic radiation.)

As a final operation, after developing to remove the uncured polymer to form the voids 8, 8', the plate was subjected to a post-curing exposure.

EXAMPLE 2

Figure 4:
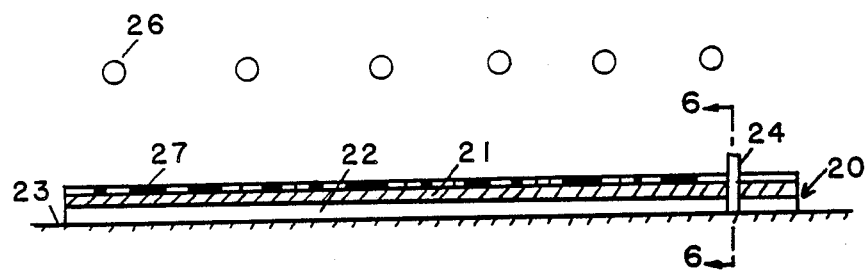
FIG. 4 shows a cross-section through a solid photopolymer type of plate on an exposure bed.
Figure 5:
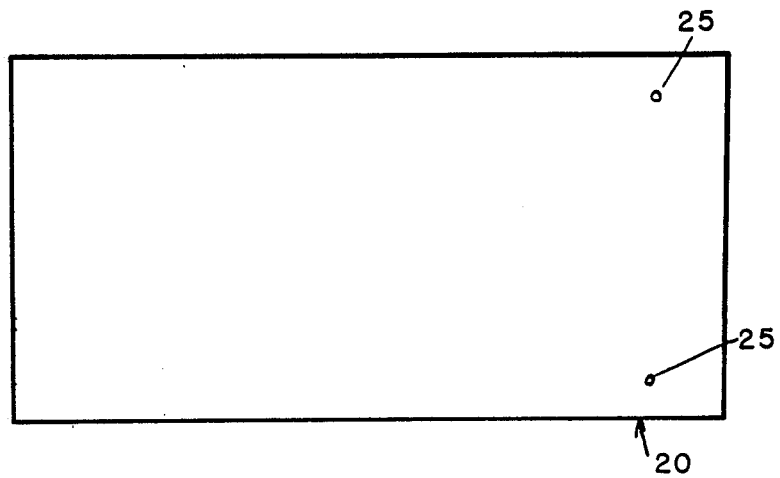
FIG. 5 shows a top plan view of the solid plate.

A "solid" photopolymer type of plate blank was used to form a printing plate by means of the apparatus shown in FIG. 4. The procedure was as follows:

The plate 20 comprising a support sheet 21 having a layer 22 of solid but uncured photopolymer thereon was placed face down (i.e. with the polymer lowermost) on an exposure table 23 equipped with registration pins 24 to match up with registration holes 25 (FIG. 5) of the plate blank 20.

An initial non-selective back exposure operation was carried out using overhead lamps 26.

Then a transparency 27 bearing a positive of the desired image was placed over the plate blank 20 on the registration pins 24. A selective back exposure operation was then carried out, again using the lamps 26.

At this stage the positive transparency 27 and the plate blank 20 were removed from the pins 24 and the plate blank 20 alone was repositioned, but this time face up (i.e. with the solid but uncured photopolymer uppermost). A further transparency (not shown) bearing a negative of the desired image was then placed on the registration pins 24 above the plate blank 20 and a second selective exposure operation was carried out as the main exposure to define the printing face of the plate to be formed from the blank 20.

After these operations the plate was removed from the pins 24 and the exposure table 23 and was subjected to a developing operation in which the uncured solid regions of photopolymer were dissolved away using a solvent therefor.

Finally a post-developing exposure operation was carried out to harden the remaining photopolymer to render the finished plate able to resist the rigours of printing.

EXAMPLE 3

A "solid" photopolymer type of plate blank was used to form a relief printing plate by the method in accordance with the present invention, using the dual exposure equipment as illustrated in FIG. 6. The procedure was as follows:

A negative film 7 was placed on the lower glass 2 (right reading emulsion up) and located by the registration pins 24 provided.

The plate 20, comprising a support sheet 21 having a layer of solid but uncured photopolymer 22 thereon was placed face down (i.e. with the polymer lowermost) over the negative film and was in turn located by the registration pins 24.

An initial non-selective back exposure operation was carried out using the overhead lamps 11.

Then a transparency 6 bearing a positive of the desired image was placed over the plate blank 20 and located by the registration pins 24. A selective back exposure operation was then carried out, again using the lamps 11, followed by a main exposure operation through the negative film 7 using the lower lamps 12 to define the printing face of the plate to be formed.

After these operations the plate was removed from the pins 24 and exposure glass 2 and was subjected to a developing operation in which the uncured solid regions of the photopolymer were dissolved away.

Finally a post-developing exposure operation was carried out to harden the resultant relief printing plate to render it able to resist the rigours of printing.

It will of course be appreciated that the back exposure operations can be carried out in either sequence, i.e. having either the non-selective exposure operation carried out first as in Examples 1 and 2 and followed by the selective back exposure operation, or having the selective back exposure operation carried out as the initial step. The main exposure operation may be carried out at any stage of the plate exposure sequence.

Although throughout the above description we have referred to the use of a positive image-bearing transparency for the selective back exposure operation, it will of course be appreciated that this positive image does not need to be an identical copy (but with colour inversion) of the image. It is, for example, possible for a so-called spread or "choked" image to be used, where what are sharp areas of contrast between the opaque and the transparency on the negative-bearing transparency are now somewhat diffuse on the positive image-bearing transparency. This may be achieved by any suitable means, for example by softening the focus during the formation of the positive image on the transparency, or by making the positive image transparency by an "off contact" copying process. The result of using this spread image type of negative will still be to provide for selective floor areas in precisely the locations where they are needed in relation to the image to be developed on the printing face of the plate blank.

The present invention can also be applied to the manufacture of large plates, for example large flexographic plates for use in printing corrugated cardboard.

Traditionally such plates have been made by exposing small printing plates which may be carried out by the methods described above, for example as set out in Examples 1 and 2, and then mounting those printing plates separately on a backing sheet which is large enough to print the entire board with a given colour in one pass. However, it is also possible to provide a large transparency which therefore has the entire surface area of the composite plate on the one sheet, with the various image panels to be printed. Such a large plate may be made up as follows:

(a) Firstly the art work can be prepared and the required number of transparencies made to allow for one positive and one negative at each of the panels to be printed.

The negatives can then be mounted on a transparent backing sheet, and a contact print taken in order to provide a positive having a dark background in the areas between the various print panels. The location of these print panels will of course be decided by the operator during a paste-up process to assemble the negatives on the white background.

(b) The negatives will then be accurately positioned on an opaque background, in the desired "paste-up" configuration and the selective main exposure operation carried out on a printing plate using this paste-up.

Either prior to this or afterwards, the exposure of the rear face of the plate blank to the positive with the dark background areas between the print panels is carried out in order to form the required floor areas for the print regions on the plate.

The thus exposed plate can then be developed by washing away all of the uncured liquid photopolymer, or dissolving away the uncured solid photopolymer in the case of a "solid" photopolymer type of plate, and the finished plate then subjected to a post-developing curing operation.

Such a plate has the advantage that there is no retention of photopolymer whatsoever in the regions between and around the print panels, and thus the border of the support sheet on which the various print panels are located as localized printing plate regions is able to be used without difficulty for securing the desired mounting means to that support sheet.

What is claimed is:

1. A process for preparing a relief printing plate comprising image-wise exposing a surface of a layer (4;22) of uncured photocurable polymer to a negative pattern of the desired image to be printed, in order to form, on the exposed surface, cured relief printing areas (10) which correspond with the transparent regions (7b) of the negative (7) and uncured areas (8) which will correspond with recessed floor portions (9) at voids formed in register with the opaque portions (7a) of the negative; and exposing the uncured polymer (4;22) through its surface opposite the first-mentioned surface to harden the floor areas (9) and the support for the said cured relief areas (10); wherein the exposing through said other surface of the polymer includes image-wise exposing the opposite surface of the layer (4;22) to a positive (6) of the image to be printed, which positive is in substantial registration with said negative such that the opaque areas of said negative correspond in extent and position to the transparent areas of said positive, thereby exposing and curing the floor areas (9) of said layer which are substantially in register with said uncured areas (8) resulting from the negative exposure operation.

2. A process according to claim 1 wherein said image-wise exposure to the positive (6) is carried out through a transparent backing sheet (3) in contact with said opposite surface of the layer and effects bonding of said opposite surface of the layer to said support sheet.

3. A process according to claim 1 wherein exposing said opposite surface further includes a non-selective further exposure of said opposite surface for further curing the floor of the printing plate.

4. A process according to claim 3 wherein said non-selective further exposure of said opposite surface precedes said image-wise exposure of the opposite surface to the positive.

5. A process according to claim 3 wherein the duration of the image-wise exposure to the positive image (7) is longer than the duration of the non-selective further exposure of said opposite surface.

6. A process according to claim 1 wherein said image-wise exposure of said opposite surface occurs simultaneously with said image-wise exposure of the first-mentioned surface to the negative.

7. A process according to claim 1 wherein the uncured photocurable polymer is a liquid polymer which hardens during the curing operation, and the exposure steps are carried out using radiation sources above and below the horizontal plate blank formed of such liquid polymer.

8. A process according to claim 1 wherein the uncured photocurable polymer is a solid polymer which can be dissolved away before curing but which is inert to the solvent after curing by photoexposure.

9. A process according to claim 1 wherein said selective exposure of said opposite surface to the positive image is carried out using a transparency (6) on which the positive image is choked, and the selective exposure of the first-mentioned said surface to a negative pattern is carried out using a transparency (7) having a sharp, half-tone negative of the desired image.

10. A printing plate formed according to the process of claim 5 wherein the relief printing plate formed comprises a large backing sheet having several print panels formed from cured liquid photopolymer, and the printing plate regions between said print panels are devoid of photopolymer by having been subjected to both selective exposure of the first-mentioned surface to negatives of the print panels with opaque regions therebetween, and exposure of the said opposite surface to positives of the print panels with opaque areas therebetween.

11. A process for preparing a flexographic relief printing plate comprising the steps of image-wise exposing a printing surface of a layer of uncured photocurable polymer to a negative pattern of the desired image to be printed, thereby forming a corresponding negative pattern of cured and uncured areas in said printing surface; image-wise exposing the surface of said layer opposite said printing surface to a positive pattern of said image which is in substantial registration with said negative pattern such that the opaque areas of said negative pattern substantially correspond in extent and position to the transparent areas of said positive pattern, thereby selectively exposing and curing the floor areas of said layer which are substantially in register with the uncured areas in said printing surface; and removing uncured polymer from said layer to form a relief image.

12. A process of claim 11 further comprising subjecting said opposite surface to a non-image-wise post-curing exposure to cure floor areas of the printing plate.

13. A process of claim 12 wherein said non-image-wise exposure of said opposite surface precedes said image-wise exposure of said opposite surface.

14. A process of claim 12 wherein the duration of said image-wise exposure of said opposite surface is longer than the duration of said non-image-wise exposure of said opposite surface.

15. A process of claim 11 wherein the uncured photocurable polymer is a liquid polymer.

16. A process of claim 11 wherein the uncured photocurable polymer is a solid polymer.

* * * * *